United States Patent
Su et al.

(10) Patent No.: US 6,724,677 B1
(45) Date of Patent: Apr. 20, 2004

(54) ESD DEVICE USED WITH HIGH-VOLTAGE INPUT PAD

(75) Inventors: Shin Su, Taipei Hsien (TW); Meng-Huang Liu, Hsinchu (TW); Chun-Hsiang Lai, Taichung (TW); Tao-Cheng Lu, Kaoshiung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/065,751

(22) Filed: Nov. 15, 2002

(51) Int. Cl.[7] .................................................. G11C 7/00
(52) U.S. Cl. ........................ 365/226; 327/525; 327/566
(58) Field of Search ..................... 365/226; 361/111, 361/59; 327/525, 566

(56) References Cited

U.S. PATENT DOCUMENTS

| | | | | |
|---|---|---|---|---|
| 5,663,678 A | * | 9/1997 | Chang | 327/566 |
| 5,751,042 A | * | 5/1998 | Yu | 257/360 |
| 5,966,026 A | * | 10/1999 | Partovi et al. | 326/27 |
| 6,014,298 A | * | 1/2000 | Yu | 361/56 |
| 6,040,733 A | * | 3/2000 | Casper et al. | 327/525 |
| 6,091,594 A | * | 7/2000 | Williamson et al. | 361/111 |
| 6,344,960 B1 | * | 2/2002 | Seo et al. | 361/111 |
| 6,351,364 B1 | * | 2/2002 | Chen et al. | 361/111 |
| 6,556,398 B1 | * | 4/2003 | Chen | 361/56 |

* cited by examiner

Primary Examiner—Richard Elms
Assistant Examiner—Hien Nguyen
(74) Attorney, Agent, or Firm—Jiang Chyun IP Office

(57) ABSTRACT

An electrostatic discharge (ESD) device used with a high-voltage input pad is described. The ESD device serves as a secondary device of a two-stage protection circuit, and comprises a substrate, a first MOS transistor and a second MOS transistor. The first MOS transistor is disposed on the substrate and comprises a first gate, a first drain and a first source, wherein the first gate is coupled to a bias Vg1, and the first drain is coupled to the high-voltage input pad. The second MOS transistor is disposed on the substrate and comprises a second gate, a second drain and a second source, wherein the second gate and the second source are both grounded, and the second drain is electrically connected with the first source of the first MOS transistor.

13 Claims, 4 Drawing Sheets

ESD DEVICE USED WITH HIGH-VOLTAGE INPUT PAD

BACKGROUND OF INVENTION

1. Field of Invention

The present invention relates to an electrostatic discharge (ESD) device. More particularly, the present invention relates to an ESD device that is used with a high-voltage input pad.

2. Description of Related Art

Electrostatic discharge (ESD) is a phenomenon where electrostatic charges migrate from a non-conductive surface via conductive material. Since an electrostatic voltage is usually quite high, the ESD phenomenon can easily damage the substrate and other components of an integrated circuit. For example, an electrostatic voltage from hundreds to thousands of volts can be created on a human body walking on a carpet under a higher relative humidity, while more than 10,000 volts can be created under a lower relative humidity. Also, an electrostatic voltage from hundreds to thousands of volts can be created in machines for packaging or testing integrated circuits. Therefore, when a human body or a machine carrying electrostatic charges contacts with a chip, a large transient ESD current is generated damaging or destroying the integrated circuits on the chip.

To protect the integrated circuits from being damaged by ESD, ESD devices capable of conducting an ESD current to ground are incorporated into the integrated circuits. The ESD devices used in electrically programmable non-volatile memory devices, most of which use a high voltage, such as 12.5 V, to generate hot electrons for programming, must be specially designed to fit with high voltages. One type of ESD protection circuit frequently used for protecting such memory devices is the two-stage circuit described below.

FIG. 1 illustrates a programmable memory apparatus and a two-stage protection circuit thereof in the prior art.

Referring to FIG. 1, a programmable memory device 101 is disposed on a substrate 100 with a high-voltage input pad 102 electrically connected thereto for providing a high voltage in a programming operation. A two-stage protection circuit 108 is coupled between the memory device 101 and the high-voltage input pad 102 to protect the memory device 101 from being damaged by ESD.

The two-stage protection circuit 108 comprises a primary device 104, a secondary device 106 and a resistor 110 coupled between them. As an ESD event happens to the programmable memory apparatus via the high-voltage input pad 102, the first device 104 serves to shunt most ESD current. The second device 106 therefore can provide the memory device 101 with a clamping voltage within a safe range.

In the prior art, a gate-grounded NMOS (GGNMOS) transistor is used as the second device 106 in the two-stage protection circuit 108. The second device 106 consisting of a single GGNMOS is illustrated in FIG. 2, wherein the gate and the source of the GGNMOS are both grounded.

However, such a secondary device has a disadvantage that its breakdown voltage is lower than the programming voltage of a non-volatile memory device that uses hot electrons for programming. Therefore, the ESD protection mechanism (breakdown mechanism) of the secondary device is triggered on programming, and a severe leakage is caused interfering with the programming operation. For example, an ordinary gate bias for hot-electron programming is about 10 V, while the breakdown voltage of a GGNMOS transistor is merely 9.5 V. Since the programming voltage of 10 V immediately causes a breakdown of the GGNMOS transistor, the programming operation cannot be well done.

SUMMARY OF INVENTION

Accordingly, this invention provides an ESD device used with a high-voltage input pad. The ESD device serves as a secondary device in a two-stage protection circuit, and provides a higher breakdown voltage as compared with the conventional secondary device.

The ESD device used with a high-voltage input pad of this invention comprises a substrate, a first NMOS transistor and a second NMOS transistor. The first NMOS transistor is disposed on the substrate and comprises a first gate, a first source and a first drain, and is preferably one without lightly doped drain regions, i.e., a non-LDD NMOS transistor. In this invention, the first gate is coupled to a positive bias Vg1, such as 3.3 V, and the first drain is coupled to the high-voltage input pad that provides a voltage higher than 10 V during a programming operation. The second NMOS transistor is also disposed on the substrate and comprises a second gate, a second drain and a second source, wherein the second gate and the second source are both grounded, and the second drain is electrically connected with the first source of the first NMOS transistor. With the first NMOS transistor, the breakdown voltage of the secondary device can be raised to 12.7 V.

This invention also provides a programmable memory apparatus, which comprises a substrate, a memory device, a high-voltage input pad and a two-stage protection circuit. The memory device and the high-voltage input pad are disposed on the substrate, and are electrically connected with each other. The two-stage protection circuit is disposed on the substrate and coupled between the memory device and the high-voltage input pad, and comprises a primary device, a secondary device and a resistor coupled between them. The secondary device comprises a substrate, a first NMOS transistor and a second NMOS transistor. The first NMOS transistor Is disposed on the substrate and comprises a first gate, a first drain and a first source, and is preferably one without lightly doped drain regions, i.e., a non-LDD NMOS transistor. In this invention, the first gate is coupled to a bias Vg1, such as 3.3 V, and the first drain is coupled to the high-voltage input pad that provides an input voltage higher than 10 V during a programming operation. The second NMOS transistor is also disposed on the substrate and comprises a second gate, a second drain and a second source, wherein the second gate and the second source are both grounded, and the second drain is electrically connected with the first source of the first NMOS transistor. With the first NMOS transistor, the breakdown voltage of the secondary device can be raised to 12.7 V. Therefore, when the memory device is being programmed with a high voltage up to 10 V, the ESD protection mechanism of the secondary device is not triggered, and the programming operation can be implemented successfully.

By using the ESD device of this invention as the secondary device in a two-stage protection circuit used with a high-voltage input pad, the breakdown voltage of the secondary device can be raised effectively. Therefore, a leakage of the secondary device can be effectively prevented.

Accordingly, in the programmable memory apparatus of this invention, the ESD device of the invention does not only protect the memory device from being damaged by ESD, but also fits with the high voltages required in a programming operation.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
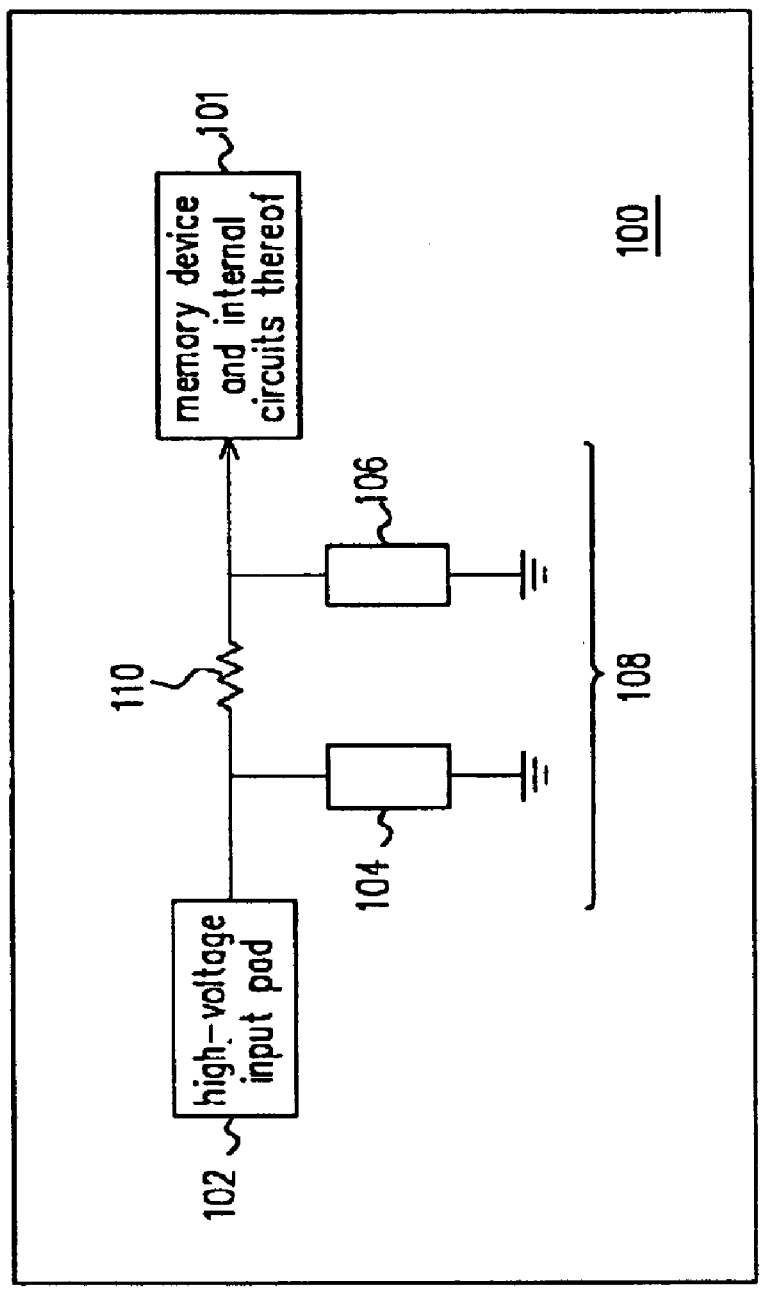
FIG. 1 illustrates a programmable memory apparatus and a two-stage protection circuit thereof in the prior art.

The programmable memory apparatus and the two-stage protection circuit thereof according to the preferred embodiment of this invention are also illustrated in FIG. 1, while the two-stage protection circuit here comprises a secondary device of this invention.

Referring to FIG. 1, the programmable memory apparatus comprises a substrate 100, and a memory device 101, a high-voltage input pad 102 and a two-stage protection circuit 108 that are disposed on the substrate 100.

The substrate 100 is, for example, a P-type substrate. The high-voltage input pad 102 is electrically connected with the memory device 101 for providing a high voltage during a programming operation. The two-stage protection circuit 108 is coupled between the high-voltage input pad 102 and the memory device 101 for protecting the memory device 101 from being damaged by ESD.

The two-stage protection circuit 108 comprises a primary device 104, a secondary-device 106 and a resistor 110 coupled between them. As an ESD event happens to the programmable memory apparatus via the high-voltage input pad 102, the first device 104 serves to shunt most ESD current. The second device 106 therefore can provide the memory device 101 with a clamping voltage within a safe range. Therefore, the memory device 101 can be effectively protected from being damaged by ESD with the preceding two-stage protection circuit 108.

The design of the secondary device 106 in the two-stage protection circuit 108, which is the feature of this invention, is described below in detail.

Figure 3:
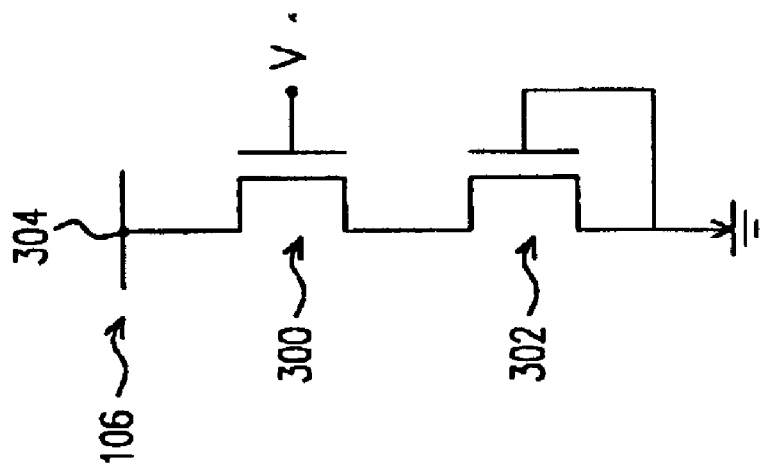
FIG. 3 illustrates a circuit diagram of a secondary device in a two-stage protection circuit according to a preferred embodiment of this invention.
Figure 2:
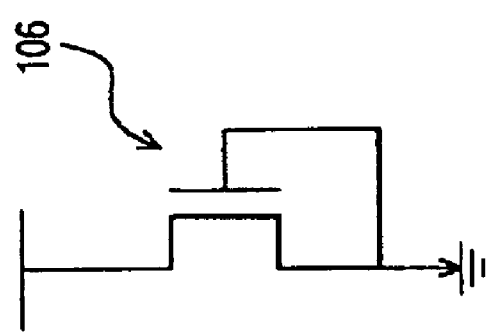
FIG. 2 illustrates a circuit diagram of the secondary device of a two-stage protection circuit in the prior art.
Figures 4, 5:
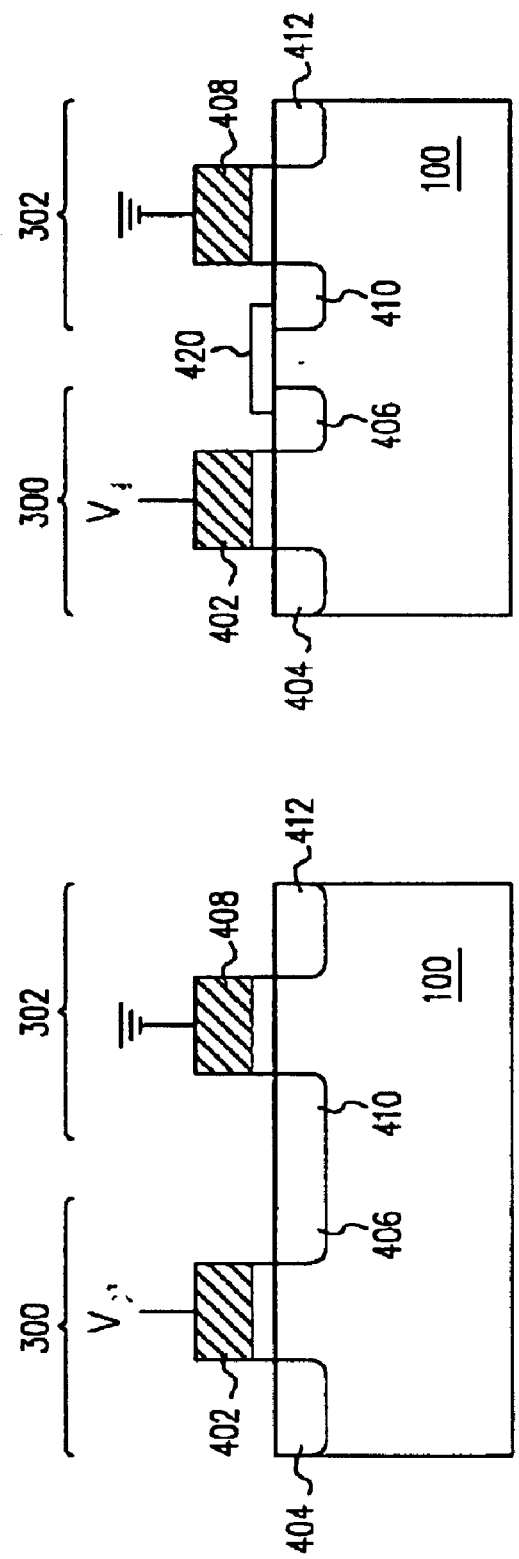
FIG. 4 illustrates a cross section of a secondary device in a two-stage protection circuit according to the preferred embodiment of this invention.
FIG. 5 illustrates a cross section of another secondary device in a two-stage protection circuit according to the preferred embodiment of this invention.

FIG. 3 and FIG. 4 illustrate a circuit diagram and a cross section, respectively, of a secondary device in a two-stage protection circuit according to the preferred embodiment of this invention. FIG. 5 illustrates a cross section of another secondary device in a two-stage protection circuit.

Referring to FIGS. 3~5, the secondary device of a two-stage protection circuit of this invention comprises a first MOS transistor 300 and a second MOS transistor 302. The first MOS transistor 300 and the second MOS transistor 302 each can be an NMOS transistor.

The first NMOS transistor 300 comprises a first gate 402, a first drain 404 and a first source 406, and is preferably one without lightly doped drain structures, i.e., a non-LDD NMOS transistor. The first gate 402 is coupled to a bias Vg1, such as 3.3 V, and the first drain 404 is coupled to an input terminal 304 that is coupled to an input voltage higher than 10 V from the high-voltage input pad 102 (FIG. 1).

The second NMOS transistor 302 comprises a second gate 408, a second drain 410 and a second source 412, wherein the second gate 408 and the second source 412 are both grounded, and the second drain 410 is electrically connected with the first source 406. The electrical connection between the first source 406 of the first NMOS transistor 300 and the second drain 410 of the second NMOS transistor 302 can be achieved by merging the two doped, regions 406 and 410 together, as shown in FIG. 4. Alternatively, a conductive line is formed to electrically connect the two doped regions 406 and 410.

Figure 6:
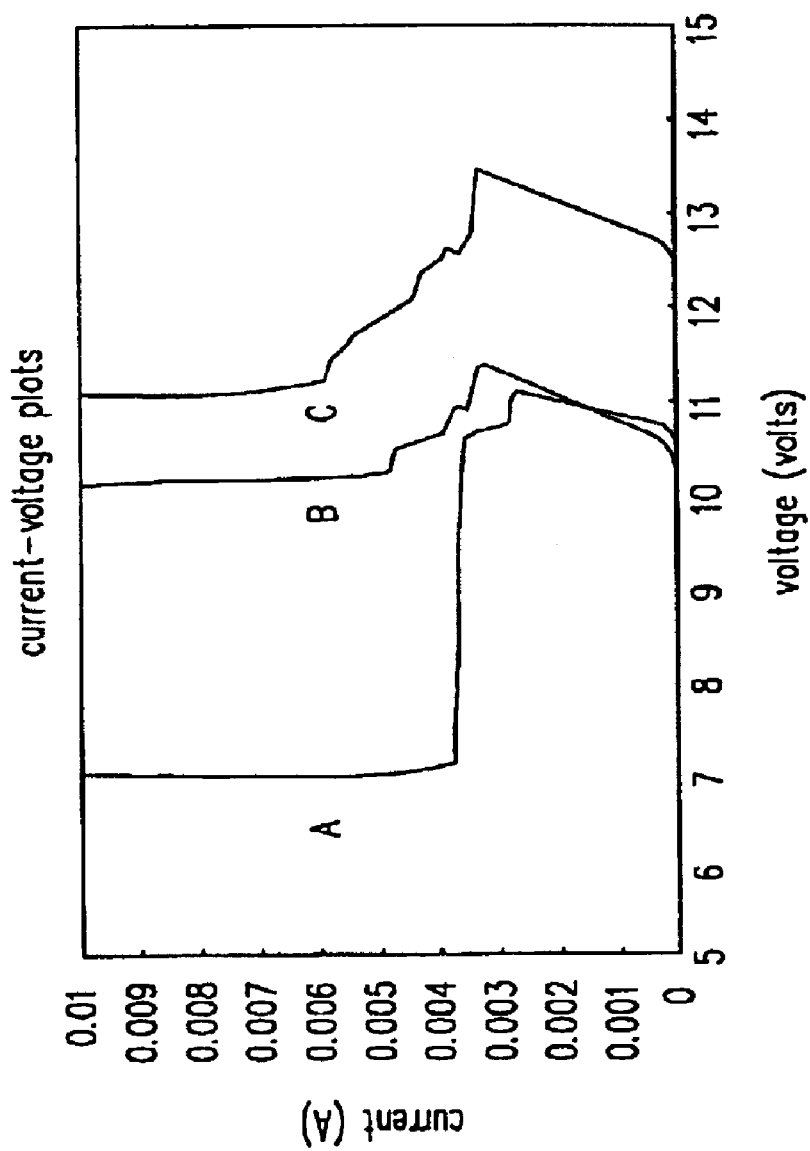
FIG. 6 shows the voltage-current (V-I) plots of the secondary device of this invention and the single GGNMOS-type secondary device in the prior art.

By applying a bias of 3.3 V to the gate 402 of the first NMOS transistor 300, the breakdown voltage of the secondary device can be raised to 12.7 V, as shown in FIG. 6. Referring to FIG. 6, curve A is a voltage-current (V-I) curve of a single GGNMOS transistor used as a secondary device in the prior art, while the breakdown voltage is estimated as 9.5 V. Curve B is a voltage-current (V-I) curve of the secondary device of this invention with 0 V applied to the gate of the first NMOS transistor, while the breakdown voltage is slightly raised to 10 V. Curve C is a voltage-current (V-I) curve of the secondary device of this invention with a positive bias Vg1 of 3.3 V applied to the gate of the first NMOS transistor, while the breakdown voltage is raised to 12.7 V.

The reasons that the breakdown voltage of the secondary device increases with the incorporation of the first NMOS transistor are described below. As a positive voltage is applied to the drain region of a NMOS transistor, the electric field at the junction corner of the drain region is strongest so that a lower breakdown voltage is caused. A single GGNMOS transistor used as the conventional secondary device has an even lower breakdown voltage since its gate is grounded and a gate-aided breakdown effect is caused. However, by inserting a first NMOS transistor in front of the GGNMOS transistor and applying a low positive voltage, such as 3.3 V, to the gate of the first NMOS transistor, a voltage drop more than one threshold voltage occurs across the drain and the source of the first NMOS transistor. Since the source of the first NMOS is coupled with the drain of the GGNMOS transistor, the voltage at the drain of the GGNMOS transistor is also lowered, and the electric field strength at the junction corner therefore is reduced. Consequently, the breakdown voltage of the whole secondary device of this invention can be raised to a higher one, such as 12.7 V. Since the breakdown voltage of the secondary device is higher than the programming voltage of the memory device, the programming operation can be implemented successfully. Moreover, as an ESD event occurs, the transient voltage input into the memory area is lower than the gate oxide breakdown voltage or the junction. breakdown voltage because of the ESD protection mechanism of the two-stage protection circuit. Therefore, the memory device can be effectively protected from being damaged by ESD.

It is noted that the first NMOS transistor in the secondary device of this invention is preferably a non-LDD NMOS transistor, which can effectively inhibit the soft leakage effect during ordinary operations of the memory device as its gate is applied with a positive bias, such as 3.3 V.

By using the ESD device of this invention as the secondary device in a two-stage protection circuit used with a high-voltage input pad, the breakdown voltage of the secondary device can be raised effectively. Therefore, a leakage of the secondary device can be effectively prevented.

Accordingly, in the programmable memory apparatus of this invention, the ESD device of the invention does not only protect the memory device from being damaged by ESD, but also fits with the high voltages required in a programming operation.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. An electrostatic discharge (ESD) device used with a high-voltage input pad, wherein the ESD device is disposed between the high-voltage input pad and an internal circuit, comprising:

a primary device disposed on a substrate, wherein the primary device is coupled to the high-voltage input pad and the internal circuit; and a secondary device disposed on the substrate between the primary device and the internal circuit, wherein the secondary device comprising:

a first MOS transistor comprising a first gate, a first drain and a first source, wherein the first gate is coupled to a bias Vg1, and the first drain is coupled to the high-voltage input pad; and a second MOS transistor comprising a second gate, a second drain and a second source, wherein the second gate and the second source are both grounded, and the second drain is electrically connected with the first source of the first MOS transistor.

2. The ESD device of claim 1, wherein each of the first MOS transistor and the second MOS transistor comprises a NMOS transistor.

3. The ESD device of claim 1, wherein the first MOS transistor comprises a non-LDD NMOS transistor.

4. The ESD device of claim 1, wherein an input voltage from the high-voltage input pad is higher than 10 V.

5. The ESD device of claim 1, wherein Vg1 is 3.3 V.

6. The ESD device of claim 1, wherein the substrate comprises a P-type substrate.

7. A programmable memory apparatus, comprising:

a substrate;

a programmable memory device on the substrate;

a high-voltage input pad on the substrate electrically connected with the memory device; and a two-stage protection circuit disposed on the substrate and coupled between the memory device and the high-voltage input pad, the two-stage protection circuit comprising a primary device and a secondary device, wherein the secondary device is disposed between the primary device and the programmable memory device, and the secondary device comprises:

a first MOS transistor disposed on the substrate, comprising a first gate, a first drain and a first source, wherein the first gate is coupled to a bias Vg1, and the first drain is coupled to the high-voltage input pad; and a second MOS transistor disposed on the substrate, comprising a second gate, a second drain and a second source, wherein the second gate and the second source are both grounded, and the second drain is electrically connected with the first source of the first MOS transistor.

8. The programmable memory apparatus of claim 7, wherein each of the first MOS transistor and the second MOS transistor comprises a NMOS transistor.

9. The programmable memory apparatus of claim 7, wherein the first MOS transistor comprises a non-LDD NMOS transistor.

10. The programmable memory apparatus of claim 7, further comprises a resistor coupled between the primary device and the secondary device.

11. The programmable memory apparatus of claim 7, wherein an input voltage from the high-voltage input pad is higher than 10 V.

12. The programmable memory apparatus of claim 7, wherein Vg1 is 3.3 V.

13. The programmable memory apparatus of claim 7, wherein the substrate comprises a P-type substrate.

* * * * *